United States Patent [19]
Buechele et al.

[11] Patent Number: 6,117,212
[45] Date of Patent: Sep. 12, 2000

[54] SYSTEM FOR EVACUATING AIR FROM A VISCOUS MEDIA

[75] Inventors: Alvin W. Buechele, Clinton Corners; John T. Butler, Hopewell Junction; Karl O. Muggenburg, Salt Point, all of N.Y.

[73] Assignee: International Business Machines Corp., Armonk, N.Y.

[21] Appl. No.: 08/898,263

[22] Filed: Jul. 22, 1997

[51] Int. Cl.[7] .................................................. B01D 19/00
[52] U.S. Cl. .............................................. 95/266; 96/193
[58] Field of Search ........................... 95/266, 254, 248, 95/247; 96/193, 194, 197

[56] References Cited

U.S. PATENT DOCUMENTS

| | | | |
|---|---|---|---|
| 2,420,356 | 5/1947 | Compa ........................................ | 95/266 |
| 2,553,359 | 5/1951 | Cook et al. ................................ | 95/254 |
| 2,797,767 | 7/1957 | Brooke et al. ............................. | 95/266 |
| 3,196,597 | 7/1965 | Piper . | |
| 3,469,369 | 9/1969 | Helmke ...................................... | 95/266 |
| 4,987,852 | 1/1991 | Sakai et al. . | |
| 5,268,077 | 12/1993 | Bubik et al. . | |
| 5,480,487 | 1/1996 | Figini et al. . | |
| 5,507,858 | 4/1996 | Jepson . | |
| 5,509,954 | 4/1996 | Derian et al. ............................. | 96/147 |
| 5,584,416 | 12/1996 | Florian ....................................... | 96/193 |

FOREIGN PATENT DOCUMENTS

| | | | |
|---|---|---|---|
| 3625980 | 2/1988 | Germany ................................. | 96/154 |
| 63-229110 | 9/1988 | Japan ....................................... | 96/154 |
| 2-152505 | 6/1990 | Japan ....................................... | 95/266 |
| 3-16606 | 1/1991 | Japan ....................................... | 96/194 |
| 412908 | 6/1974 | U.S.S.R. .................................. | 95/266 |
| 743693 | 6/1980 | U.S.S.R. .................................. | 95/266 |

*Primary Examiner*—Duane S. Smith
*Attorney, Agent, or Firm*—Ratner & Prestia; Ira D. Blecker

[57] ABSTRACT

A device and method enabling the de-aeration of viscous media. The device includes a transfer cylinder and a piston for urging the viscous media from a first container, a separator for separating air from the viscous media to create de-aerated viscous media, and a second container to contain the de-aerated viscous media. The de-aerated viscous media may be returned to the first container by urging the de-aerated viscous media from the second container with a second piston back though the separator and into the first container.

12 Claims, 10 Drawing Sheets

SYSTEM FOR EVACUATING AIR FROM A VISCOUS MEDIA

FIELD OF THE INVENTION

This invention generally relates to multilayer ceramic substrates for integrated circuit package structures and, more particularly, to an apparatus and method for evacuating air from a metalizing paste used to form circuit patterns on multilayer ceramic substrates.

BACKGROUND OF THE INVENTION

In the manufacture of multilayer ceramic (MLC) substrates for integrated circuit semiconductor package structures, metalizing paste is deposited in appropriate patterns and in the holes on the surfaces of the sheets, the sheets are stacked, and the sheets are subsequently fired at a sintering temperature. The package is made up of as many as five to one-hundred subcomponents (layers). Each of these layers represents a discrete level of wiring in the package. A layer is made up of two materials: ceramic and molybdenum paste, although other pastes, such as copper or tungsten, may be used. The ceramic forms the base or substrate and the molybdenum paste is used to personalize or "wire" the layer.

The wiring on each layer consists of interconnection holes known as vias and a distinct pattern on the layer surface. The vias are punched holes in the ceramic sheet that are filled with molybdenum paste. In a typical MLC product, the ceramic sheets have thousands of vias. The vias provide the interconnection to the next layer above or below. The pattern on the surface provides a vehicle to transmit signals in the x/y direction of the layer. Also the pattern connects to the layer above or below.

A partial cross-sectional view of a typical MLC is shown in FIG. 1. In FIG. 1, substrate 100 has a metalizing paste (not shown) disposed on a surface to form via 102 and lines 104. The cross-sectional dimensions of vias 102 and lines 104 are in the 0.100 mm to 0.200 mm (0.004 in. to 0.008 in.) range. It is of critical importance that the integrity of the lines and vias is maintained. An open/break in a line or via can result in an electrical defect and render the package unusable. Thus, it is extremely important that the paste is of a consistent high quality and is also air-free.

Air pockets of various sizes in the metalizing paste that is used to personalize ceramic greensheets cause defects. These air pockets cause two types of defects: voids in the lines on the greensheet surface or incomplete fills of the vias which interconnect the layers of the package. Therefore, it is necessary to de-aerate the metalizing paste before applying it to the MLC. The metalizing paste is highly viscous (thick) with a viscosity in the range of 35–60 Pa-sec (a measure of viscosity).

Each layer is personalized using a paste dispensing unit and a mask or stencil. A conventional dispensing unit is shown in FIGS. 2 and 3. FIG. 3 is a cross sectional view along line 3—3 of FIG. 2. As illustrated in FIGS. 2 and 3, dispensing unit 200 consists of a reservoir 300 to hold screening cartridge 310 containing paste 302 and a nozzle 304 for the delivery of paste 302 onto mask 202. Paste 302 is pressurized and flows from nozzle 304 into mask 202. The pressure of the paste 302 forces it into the openings in mask 202 and into any corresponding vias in substrate layer 308. The assembly is indexed along the mask (see arrow "A" in FIG. 2) in order to personalize the entire substrate layer. Holes (not shown) in mask 202 define the final pattern on the substrate layer and also ensure that all vias are filled.

The air pockets mentioned above originate during process steps in the fabrication of the paste as well as during the transfer of paste 302 to screening cartridge 310. Screening cartridge 310 allows paste 302 to be easily transferred from the large containers (typically used to contain the metalizing paste) to dispensing unit 200. Because the paste is extremely viscous, the act of removing air pockets becomes a challenging project. Attempting to draw the air out of the paste by conventional vacuum techniques proves to be a time consuming and inefficient process.

U.S. Pat. No. 4,987,852 issued to Sakai et al. discloses a conventional method for removing air from a low viscosity liquid and is illustrated in FIGS. 4A and 4B. In FIG. 4A, paint 400 (a low viscosity material) is introduced into upper section 402 of chamber 404 via inlets 406. Paint 400 flows in the direction of arrows "B". Paint 400 is drawn into lower section 408 of chamber 404 through strainer 410 by a vacuum supplied at vacuum port 412. Air released as paint 400 passes through strainer 410 is removed by vacuum port 412. To prevent paint 400 from being drawn into vacuum port 412, shield 414 protects vacuum port 412. The strained paint is removed from lower chamber 408 through lower port 420.

FIG. 4B is a view of strainer 410 through section 4B—4B of FIG. 4A. As shown in FIG. 4B, strainer 410 has slits 416 incorporated into the surface 418 of strainer 410. The passage of paint 400 through slits 416 results in ribbons of paint flowing from upper section 402 into lower section 408.

This approach has disadvantages in that highly viscous (thick) materials cannot be drawn into the lower chamber merely by vacuum and that creating slits in a strainer is very costly and time consuming.

SUMMARY OF THE INVENTION

To solve the aforementioned disadvantages of conventional de-aeration devices and methods, the present invention relates to an apparatus and method for evacuating air from a viscous media. The apparatus urges the viscous media from a first container through a separator to deliver de-aerated viscous media into a second container.

It is an object of the invention to remove the air entrapped in a highly viscous material by a design which incorporates a paste supply chamber, an evacuated chamber and a sieve plate which separates the two chambers. When the top chamber is pressurized, the paste will flow through the sieve plate into the evacuated chamber below. The sieve plate breaks the solid flow from the upper chamber into many tiny cylinders. For example, a sieve plate having 0.254 mm (0.010 in.) Diameter holes will result in 0.254 mm (0.010 in.) diameter cylinders of paste flowing into the evacuated chamber. Because the chamber is evacuated and the cylinders of paste are very narrow, the path for the air trapped in the paste to be evacuated will be very small. Thus, a complete evacuation of air can be accomplished quickly and efficiently.

The present invention also relates to an apparatus for restoring the de-aerated viscous media into the original container for use in subsequent operations. The present invention further relates to an apparatus for de-aerating a viscous media where the separator has a plurality of apertures for removing entrapped air from the viscous media. Each of the apertures may have a smooth annular entry and exit.

The present invention further relates to an apparatus for de-aerating a viscous media through a de-aerator having holes with a diameter ranging from 0.127 mm to 0.635 mm (0.005 in.–0.025 in.). The present invention still further relates to an apparatus for removing the air from the chamber which is released from the viscous media. The present invention finally relates to a method for de-aerating a viscous media by urging the viscous media from a storage container through a de-aerator and into a second storage container.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE PREFERRED EMBODIMENTS

Figure 1:
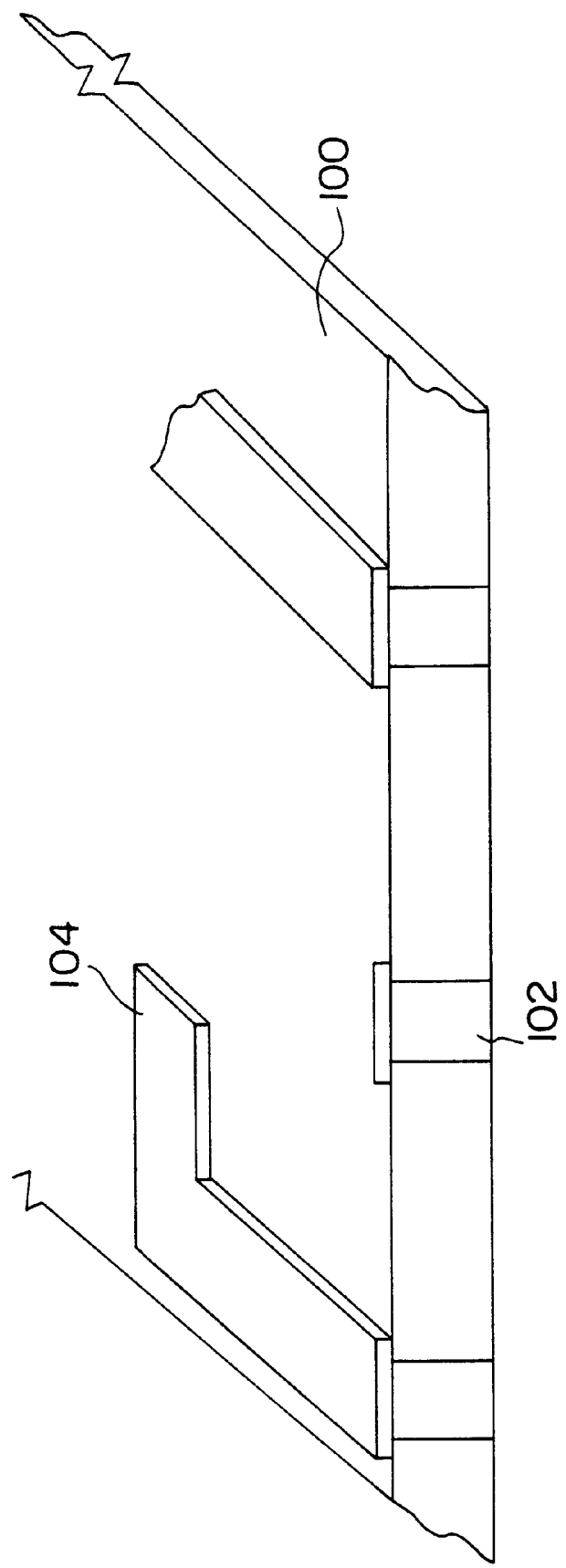
FIG. 1 is a partial cross-sectional view of a layer of a typical MLC.
Figure 2:
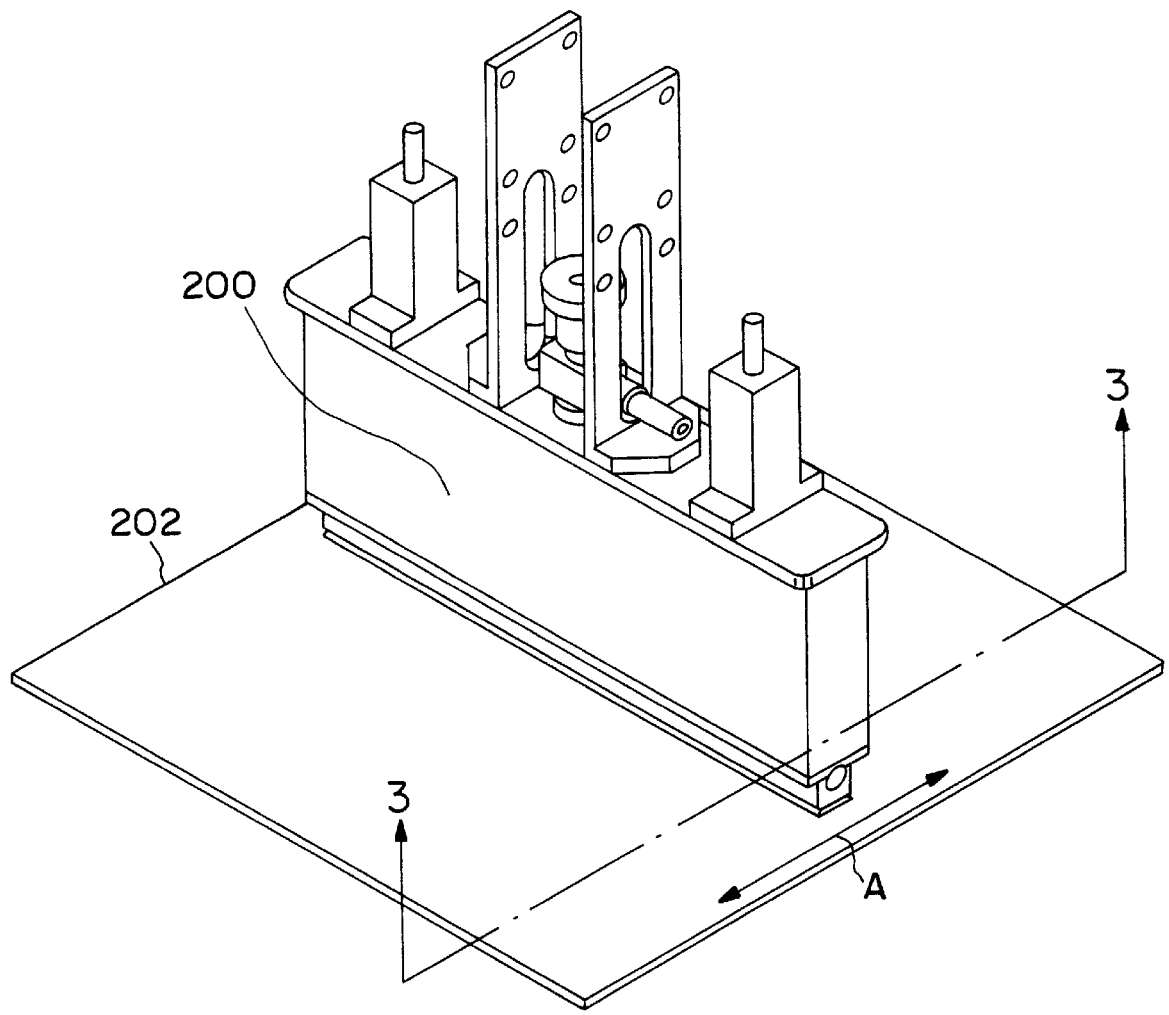
FIG. 2 is a perspective view of a conventional paste dispensing unit.
Figure 3:
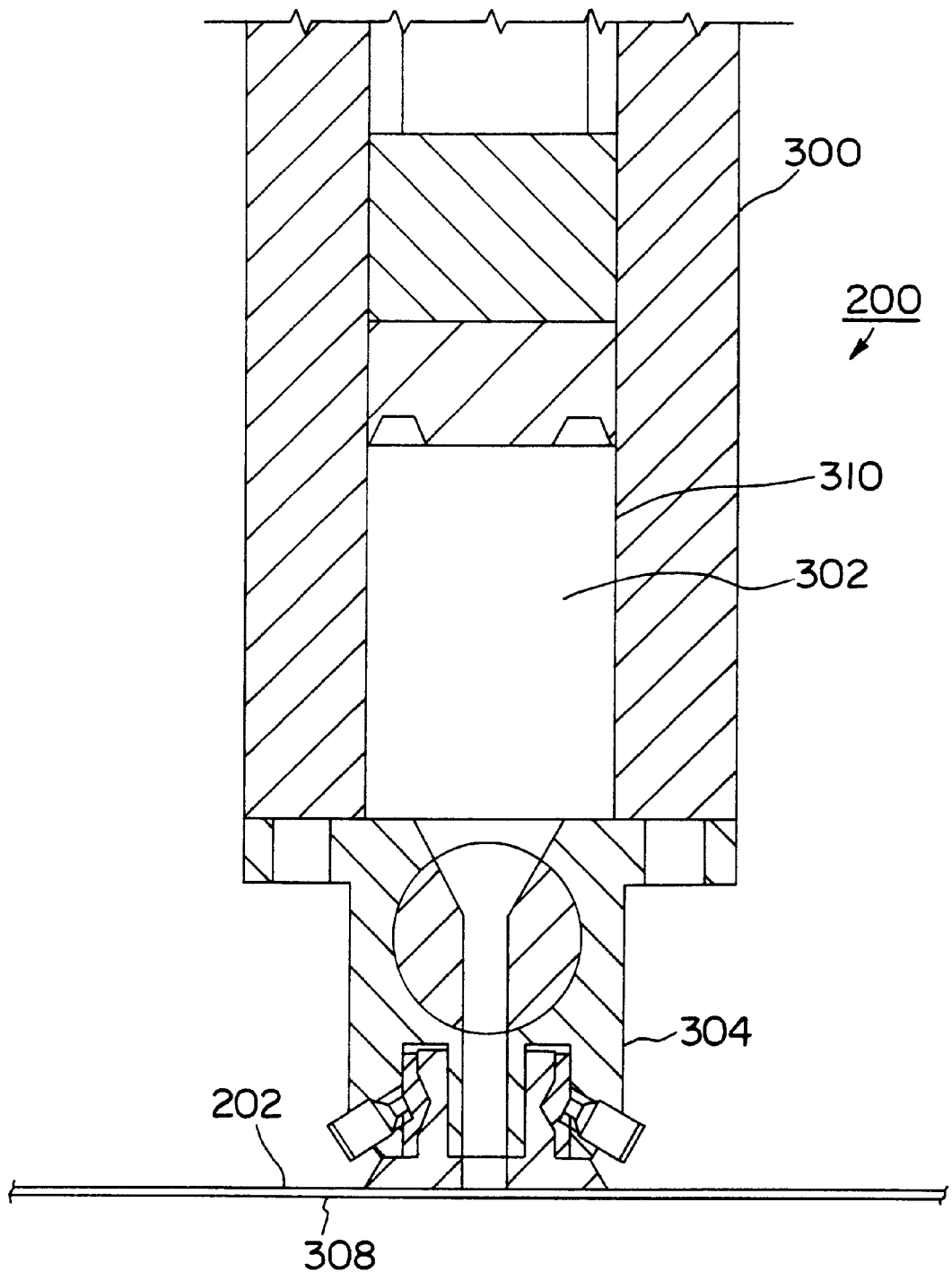
FIG. 3 is a cross-sectional view of the paste dispensing unit of FIG. 2 across section 3—3.
Figure 4A:
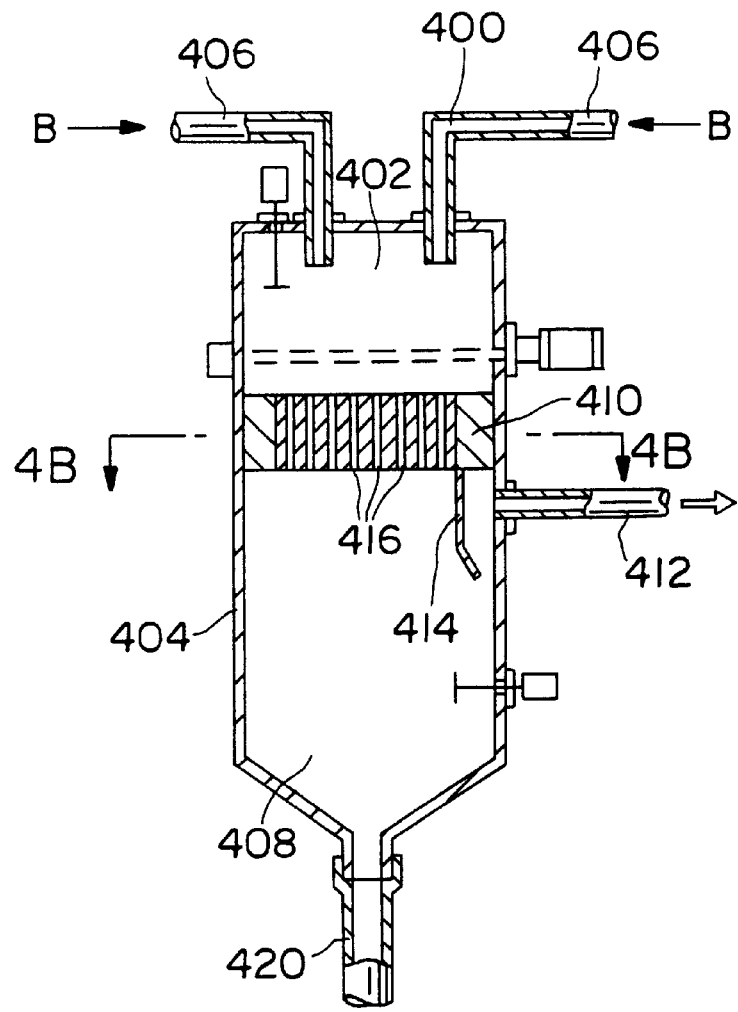
FIG. 4A is a side sectional view of a conventional paint de-aeration system.
Figure 4B:
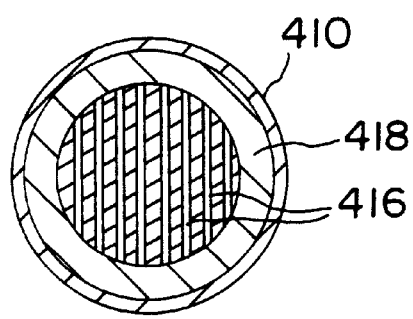
FIG. 4B is a cross sectional view of the conventional paint de-aeration system of FIG. 4A across section 4B—4B.
Figure 5:
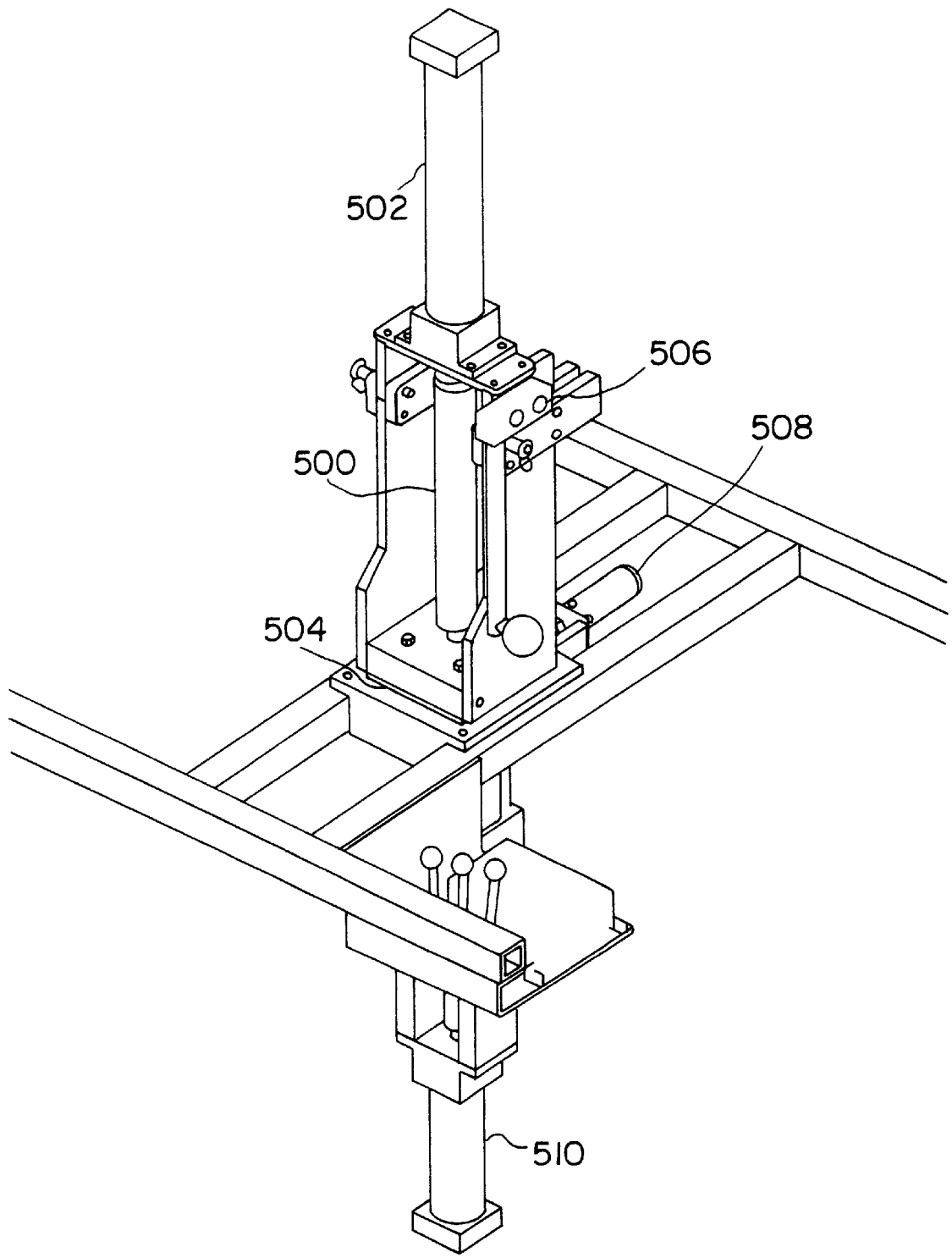
FIG. 5 is a perspective view of an exemplary embodiment of the present invention.

Referring to FIG. 5, a perspective view of an exemplary embodiment of the present invention is shown. In FIG. 5, paste cartridge 500 is disposed between upper transfer cylinder 502 and sieve plate 504 by tilting transfer cylinder 502 about pivot 506. Vacuum valve 508 withdraws air that is removed from the paste (not shown) contained within paste cartridge 500 after the paste is de-aerated. FIG. 5 also shows refill cylinder 510 which may be used to return the de-aerated paste to paste cartridge 500 for subsequent operations, such as placement into a conventional paste extruding system.

Figure 6:
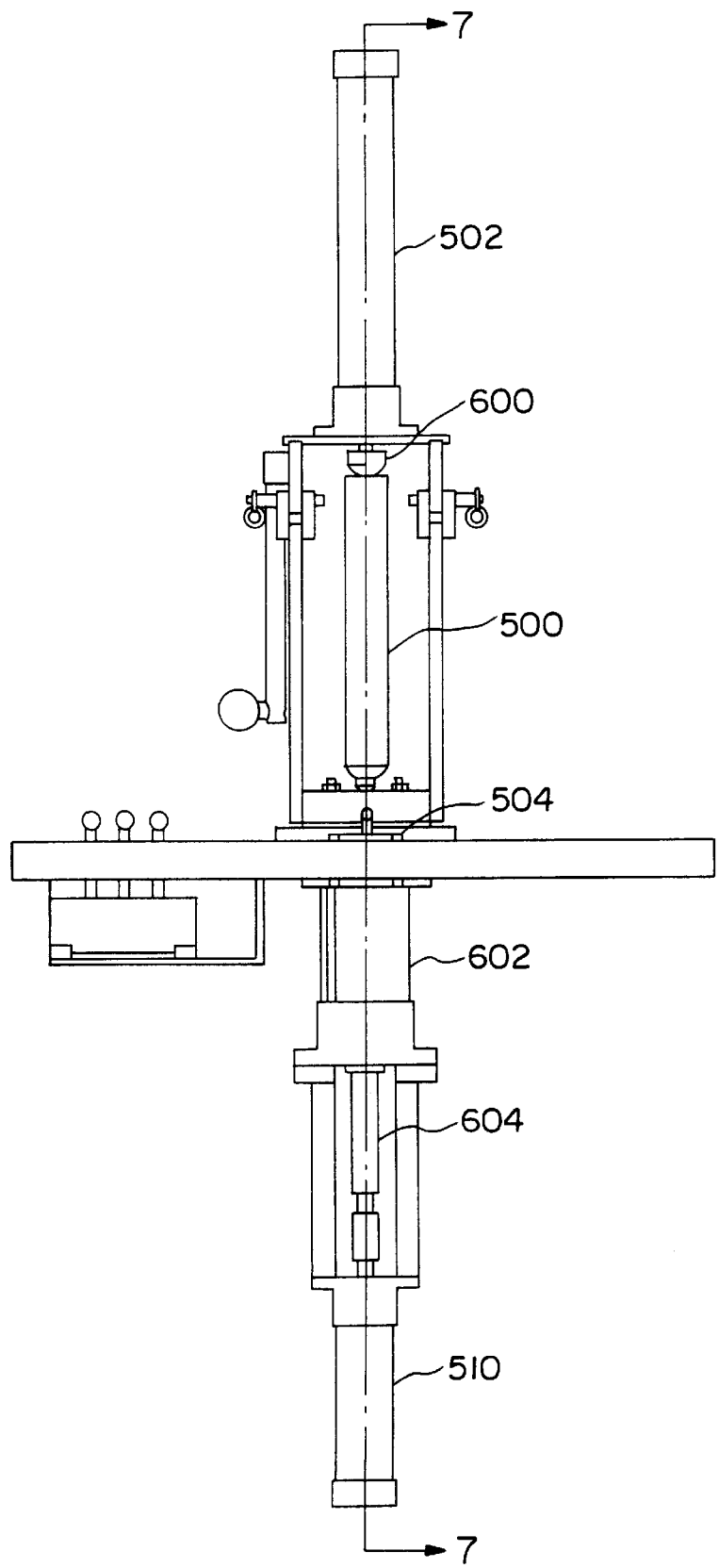
FIG. 6 is a side view of the exemplary embodiment shown in FIG. 5.

Referring to FIG. 6, a side view of the exemplary embodiment of the present invention is shown. In FIG. 6 identical elements shown in FIG. 5 are identically labeled. In FIG. 6, upper piston 600, reservoir 602, and lower piston 604 are also shown. The paste is removed from paste cartridge 500 by the downward force of upper piston 600 operating in cooperation with upper transfer cylinder 502. The de-aerated paste may be transferred back into paste cartridge 500 by lower piston 604 operating in cooperation with refill cylinder 510. Upper transfer cylinder 502 and refill cylinder 510 are controlled by an external pressure system (not shown).

Figure 7:
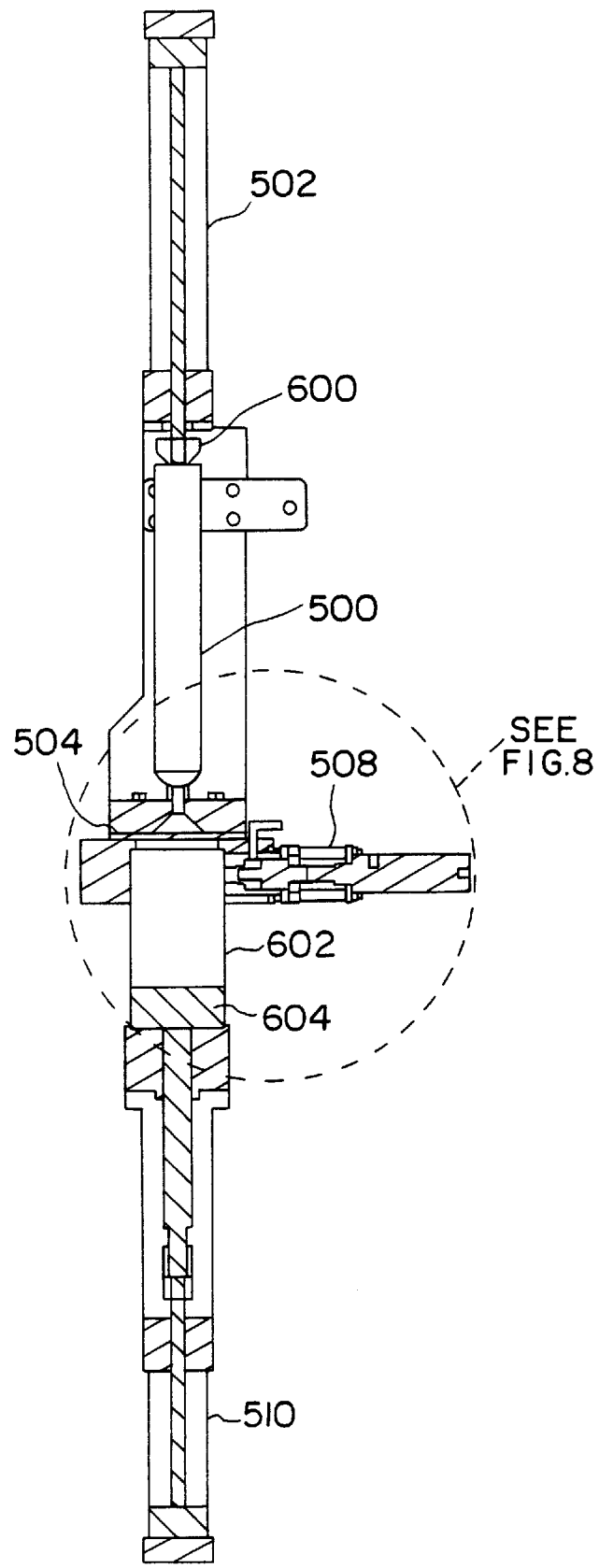
FIG. 7 is a cross-sectional view of the exemplary embodiment of FIG. 6 across section 7—7.

FIG. 7 is a cross-sectional view through section 7—7 of FIG. 6 and shows additional detail with respect to how lower piston 604 and vacuum cylinder 508 interact with reservoir 602. Referring to FIG. 7, as the paste is forced from paste cartridge 500, the paste passes through sieve plate 504. The effect of the paste passing through sieve plate 504 is to create thin cylinders of paste according to the size of the apertures (not shown in this figure) that are part of sieve plate 504. Air entrapped in the paste before the paste passes through sieve plate 504 will be removed from the paste as the paste emerges from sieve plate 504 and enters reservoir 602. This is because the size of the cylinders of paste created by sieve plate 504 are small enough to allow the entrapped air pockets to "explode" from the paste as the paste emerges from sieve plate 504.

The de-aerated paste falls to the bottom of reservoir 602 by force of gravity and pressure. The air that is removed from the paste also collects within reservoir 602. To prevent a negative pressure on upper piston 600, vacuum valve 508 is provided to removed the collected air. Vacuum value 508 may be operated continuously or periodically during the de-aeration process. The amount of vacuum required is small because the purpose of vacuum valve 508 is to remove entrapped air from reservoir 602 rather than to draw the paste through sieve plate 504 from paste cartridge 500.

Figure 8:
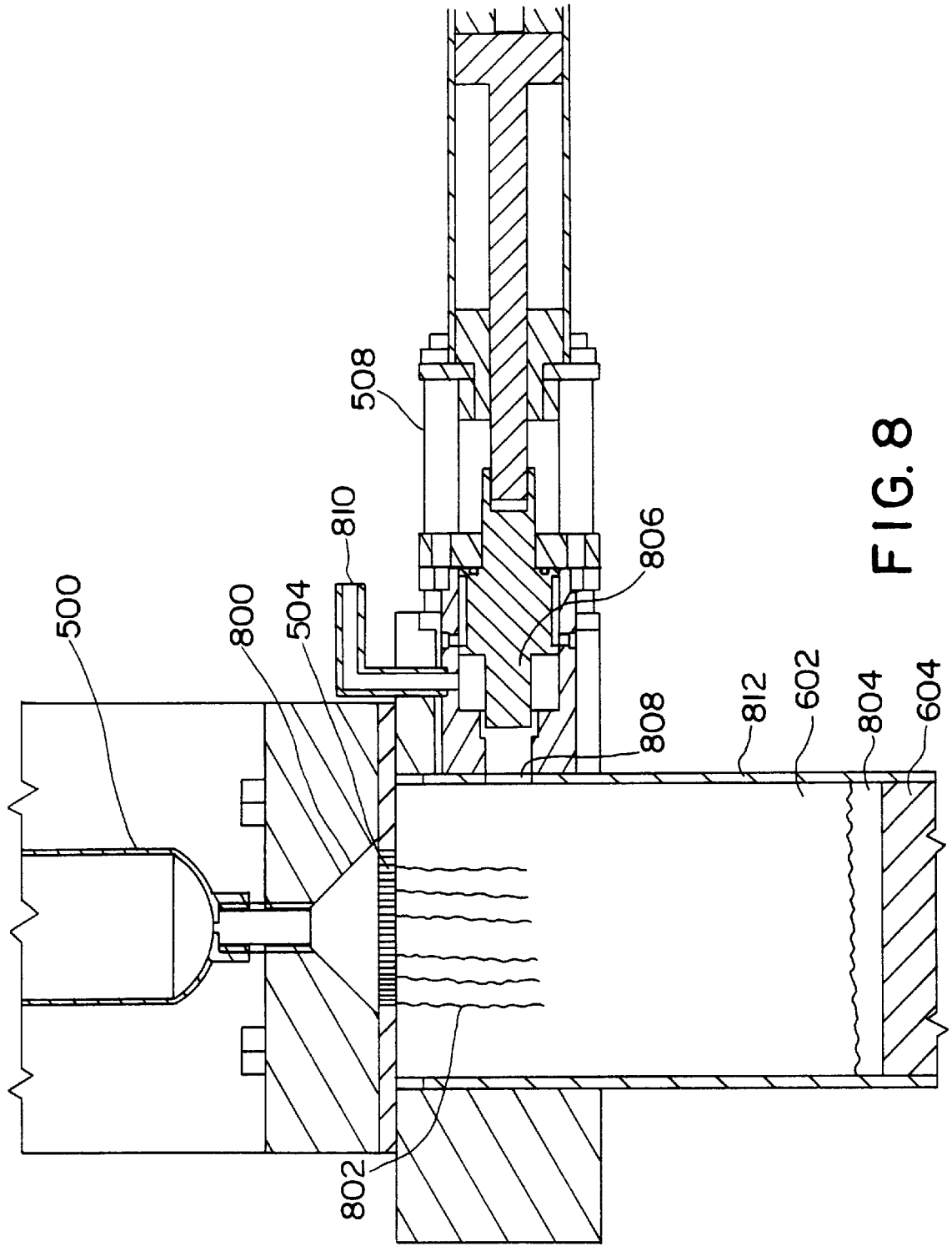
FIG. 8 is a detailed section view of the exemplary embodiment of FIG. 7 at section 8—8.

FIG. 8 is an enlarged view of section 8—8 of FIG. 7. Referring to FIG. 8, as the paste is forced from paste cartridge 500 by upper piston 600 (not shown in this figure), the paste enters chamber 800 which acts to spread the paste over the top surface of sieve plate 504. The continued pressure exerted by upper piston 600 on the paste results in paste cylinders 802 emerging into reservoir 602 and collecting at the bottom of reservoir 602 as de-aerated paste 804. As it is released from the paste, the air collects in reservoir 602 and must be removed in order to maintain a sufficient vacuum in reservoir 602. If sufficient vacuum is not maintained in reservoir 602 the de-aeration process will be affected. To release this air, vacuum valve 508 is activated by drawing back vacuum piston 806 so that the air contained in reservoir 602 may be extracted through orifice 808 and vacuum port 810 by a vacuum source (not shown).

De-aerated paste 804 may now be removed from reservoir 602 for use in further processes. This may be accomplished in several ways. One way is to remove reservoir 602 from the de-aeration system and "scoop" the de-aerated paste 804 from reservoir 602 and place the de-aerated paste into another system, such as an extruding system (not shown). Another way is to remove reservoir 602 and use a further pressure system (not shown) to force the de-aerated paste 804 through an opening (not shown) at the bottom portion of reservoir 602. This opening may either be a removable plug (not shown) or a retractable cover (not shown), for example. A third way is to return the de-aerated paste to paste cartridge 500. This may be accomplished by using lower piston 604, under control of refill cylinder 510, to push de-aerated paste 804 back through sieve plate 504 and chamber 800 into paste cartridge 500. The paste cartridge 500 containing de-aerated paste 804 may now be used in subsequent operations. Before the paste may be pushed back into paste cartridge 500, however, orifice 808 must be closed so that de-aerated paste 804 is not forced out through vacuum port 810. This is accomplished by activating vacuum piston 806 to move toward reservoir 602 and seal off orifice 808. Once vacuum piston 806 is flush with wall 812 of reservoir 602, lower piston 604 may be activated to push de-aerated paste 804 into paste cartridge 500.

Figure 9:
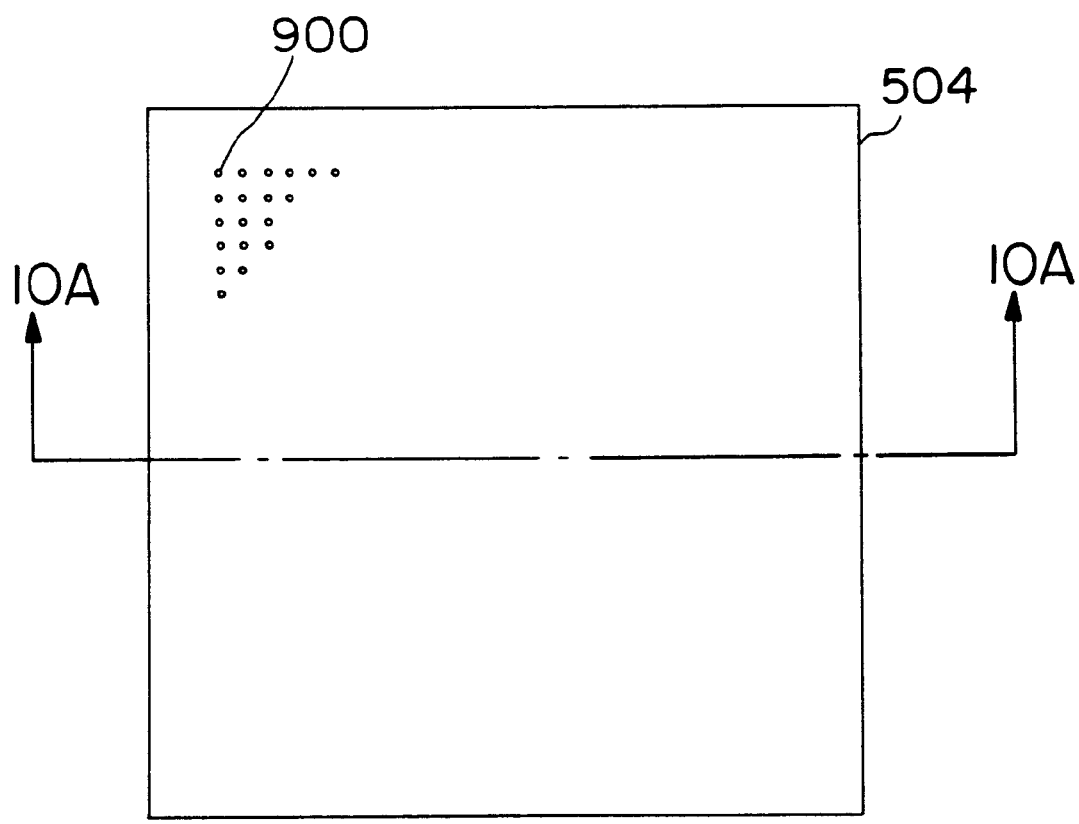
FIG. 9 is plan view of a sieve plate of an exemplary embodiment of the present invention.

FIG. 9 is a plan view of sieve plate 504 according to an exemplary embodiment of the present invention. Sieve plate 504 may be a 25.40 mm (1.00 in.) square, 2.540 mm (0.100 in.) thick piece of a hardened steel, for example, although any other shape, such as a circular sieve plate, or any other suitable thickness, may be used. Sieve plate 504 may have 0.254 mm (0.010 in.) diameter holes 900 milled on 0.635 mm (0.025 in.) centers, for example, although other hole diameters and centers may be used. This spacing between holes 900 may be determined so as to prevent paste from accumulating on the entry surface of sieve plate 504. Holes 900 will be the channels that pass the paste as it flows from the paste cartridge 500 to reservoir 602.

Figure 10A:
FIGS. 10A–10D are alternative cross-sectional views of the exemplary embodiment of FIG. 9 across section 10—10.

FIGS. 10A–10D are alternative partial cross-sectional views of sieve plate 504. Referring to FIG. 10A, a first exemplary embodiment of sieve plate 504 is shown. In FIG. 10A, holes 900 are shown as holes having a single uniform diameter through sieve plate 504. The diameter of holes 900 may range from 0.127 mm (0.005 in.) to 0.635 mm (0.025 in.), for example, and may be placed on 0.254 mm (0.010 in.) to 0.762 mm (0.030 in.) centers, for example, depending on the diameter of holes 900, although other hole diameters and centers may be used depending on the viscosity of the material to be de-aerated.

Figure 10B:
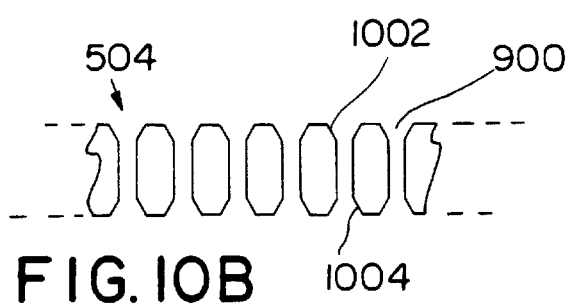

It may be difficult to machine sieve plate 504 with a uniform diameter at the entry and exit point of sieve plate 504. Therefore, a second exemplary embodiment of sieve plate 504 is shown in FIG. 10B. In FIG. 10B, sieve plate 504 is shown as having a smooth annular entry point 1002 and a smooth annular exit point 1004. The relative difference in the diameter of annular entry point 1002 and annular exit point 1004 to the diameter of hole 900 may be 3:1, for example, although other ratios may be used depending on the thickness and material used for sieve plate 504.

Figure 10C:
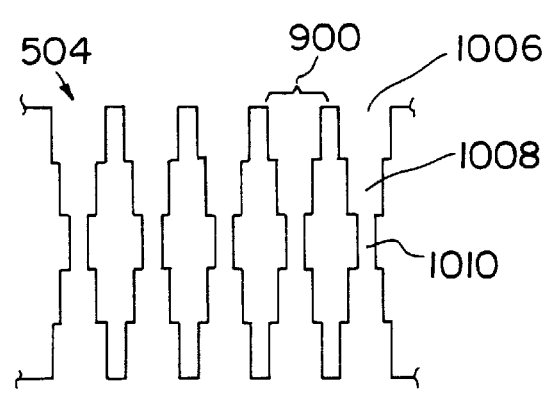

To allow for easier passage of the paste through sieve plate 504, another exemplary embodiment of sieve plate 504 is shown in FIG. 10C. In FIG. 10C, holes 900 are made up of a series of apertures having several diameters. The central aperture 1010 of hole 900 has the diameter of the paste cylinder 802. On either side of central aperture 1010 is second aperture 1008 with a diameter larger than the diameter of central aperture 1010. Next, outer aperture 1006 is placed between either surface of sieve plate 504 and second aperture 1008. In this way, sieve plate 504 allows for easier passage of the paste through holes 900 while still maintaining the desired thickness of paste ribbons 804. By providing uniformity to the apertures on both sides of sieve plate 504, sieve plate 504 may be used without regard as to which surface is placed next to paste cartridge 500. Furthermore, this allows for reintroduction of the de-aerated paste 804 into paste cartridge 500 as mentioned above.

Figure 10D:
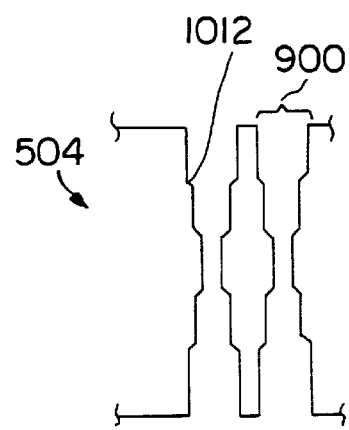

Tools for boring holes in sieve plate material may have a flat or annular boring surface. With respect to FIG. 10C, it is assumed that a tool with a flat boring surface is used to form the apertures 1006 and 1008 in sieve plate 504. As tools of this type are more expensive to procure and maintain than tools with an annular boring surface, a fourth alternative exemplary embodiment is now considered. In FIG. 10D, holes 900 are formed similarly to those formed as discussed above with respect to FIG. 10C. Instead of flat surfaces between each of the orifices, however, a smooth annular surface 1012 is formed between each of the orifices. This allows for easier fabrication of sieve plate 504 as well as easier passage of the paste through sieve plate 504 without a possibility of paste remaining trapped along the sharp edges between the apertures. The relative differences between the diameter of the apertures may be, for example, 2:1 between central aperture 1010 and second aperture 1008, and 3:1 between central aperture 1010 and outer aperture 1006, although other ratios may be used depending on the thickness and material used for sieve plate 504. Although in this exemplary embodiment five separate apertures are shown, the embodiment is not limited as such and any number of apertures may be used according to the type of material to be de-aerated and the sieve plate material used.

Although the exemplary embodiment indicates that the paste is supplied in paste cartridge 500, alternative ways of supplying the paste to sieve plate 504 may be contemplated, such as through a hose, pipe or any other feed mechanism.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An apparatus for use with a viscous media contained in a first container, the apparatus comprising:

first urging means for urging the viscous media from the first container, separating means for separating air from the viscous media to create de-aerated viscous media, the separating means disposed below the first urging means, second containing means for containing the de-aerated viscous media disposed below the separating means, vacuum means for removing air from the second containing means, and second urging means for urging the de-aerated viscous media from the second container back through the separating means and into the first container.

2. The apparatus of claim 1, wherein the separating means contains a plurality of holes, the plurality of holes extending from a top surface to a bottom surface of the separating means.

3. The apparatus of claim 2, wherein the separating means is a plate.

4. The apparatus of claim 3, wherein each of the plurality of holes has a diameter in the range of about 0.127 mm (0.005 in.) to 0.635 mm (0.025 in.) and maintains a spacing between each hole in a range of 0.254 mm (0.010 in.) to 0.762 mm (0.030 in.).

5. The apparatus of claim 4, wherein each of the plurality of holes has a smooth annular entry and exit.

6. The apparatus of claim 4, wherein each of the plurality of holes is comprised of three apertures coupled to one another in a linear arrangement, the first of the three apertures having a first diameter in the of about 0.380 mm to 0.762 mm (0.015 in. to 0.025 in.) extending from the upper surface of the plate to a first distance below the upper surface of the plate, the second of the three apertures having a second diameter in the range of about 0.127 mm to 0.380 mm(0.005 in. to 0.015 in.) extending from the first distance below the upper surface of the plate to a second distance below the upper surface of the plate, the second diameter smaller than the first diameter of the first aperture, and the third of the three apertures having a third diameter in the range of about 0.380 mm to 0.762 mm (0.015 in. to 0.025 in.) extending from the second distance below the upper surface of the plate to the bottom surface of the plate, the third diameter larger that the second diameter of the second aperture.

7. The apparatus of claim 6, wherein each of the plurality of apertures has a smooth annular entry and exit.

8. The apparatus of claim 4, wherein each of the plurality of holes is comprised of five apertures coupled to one another in a linear arrangement, the first of the five apertures having a first diameter in the range of about 0.380 mm to 0.762 mm (0.015 in. to 0.025 in.) extending from the upper surface of the plate to a first distance below the upper surface of the plate, the second of the five apertures having a second diameter in the range of about 0.254 mm to 0.508 mm (0.010 in. to 0.020 in.) extending from the first distance below the upper surface of the plate to a second distance below the upper surface of the plate, the second diameter being smaller than the first diameter of the first aperture, the third of the five apertures having a second diameter in the range of about 0.127 mm to 0.254 mm (0.005 in. to 0.010 in.) extending from the second distance below the upper surface of the plate to a third distance below the upper surface of the plate, the third diameter smaller than the second diameter of the second aperture, the fourth of the five apertures having a fourth diameter in the range of about 0.254 mm to 0.508 mm (0.010 in. to 0.020 in.) extending from the third distance below the upper surface of the plate to a fourth distance below the upper surface of the plate, the fourth diameter being larger than the third diameter of the third aperture, and the fifth of the five apertures having a third diameter in the range of about 0.380 mm to 0.762 mm (0.015 in. to 0.025 in.) extending from the fourth distance below the upper surface of the plate to the bottom surface of the plate, the fifth diameter being larger than the fourth diameter of the fourth aperture.

9. The apparatus of claim 8, wherein each of the plurality of apertures has a smooth annular entry and exit.

10. The apparatus of claim 1, further comprising:

vacuum means for evacuating air released from the viscous media, the vacuum means coupled to the second containing means.

11. The apparatus of claim 10, said vacuum means further comprising control means for controlling evacuation of air released from the second containing means.

12. A method for use with a viscous media contained in a first container, the method comprising the steps of:

(a) urging the viscous media from the first container, (b) separating air from the viscous media in a second container to create de-aerated viscous media and air, (c) containing the de-aerated viscous media in the second container, (d) removing the separated air from the second container, and (e) returning the de-aerated viscous media to the first container.

* * * * *